United States Patent [19]

Sasaki et al.

[11] Patent Number: 4,562,437
[45] Date of Patent: Dec. 31, 1985

[54] DIGITAL LOOP FILTER

[75] Inventors: Shunroku Sasaki, Yokohama; Kazuo Tsukada, Kakogawa; Yoshiharu Kanzaki, Sagamihara; Yoshikazu Hori, Yokohama, all of Japan

[73] Assignee: Fujitsu Limited, Kawasaki, Japan

[21] Appl. No.: 453,112

[22] Filed: Dec. 27, 1982

[30] Foreign Application Priority Data

Dec. 29, 1981 [JP] Japan ................... 56-211395

[51] Int. Cl.$^4$ .............................................. G01S 1/30
[52] U.S. Cl. .................... 343/394; 343/442; 328/167; 364/724
[58] Field of Search .......... 328/167; 364/724; 343/394, 442; 377/47

[56] References Cited

U.S. PATENT DOCUMENTS

| | | | |
|---|---|---|---|
| 4,027,264 | 5/1977 | Gutleber | 328/167 |
| 4,032,857 | 6/1977 | Lum | 328/167 X |
| 4,086,539 | 4/1978 | Gustafson et al. | 328/167 X |
| 4,477,919 | 10/1984 | Borras et al. | 377/47 |

FOREIGN PATENT DOCUMENTS

2061656-A  5/1981  United Kingdom .

OTHER PUBLICATIONS

Proceedings of the IEEE, "Radar and Gold: Digital Filter Design Techniques", Feb. 1967, pp. 150–151.
IEEE Transactions on Acoustics, Speech and Signal Processing, Apr. 1975, pp. 238–239, Dec. 1975, pp. 560–561.

Primary Examiner—Theodore M. Blum
Assistant Examiner—John B. Sotomayor
Attorney, Agent, or Firm—Staas & Halsey

[57] ABSTRACT

A digital loop filter is used in a phase-tracking circuit which is adaptable to a phase-comparison radio navigation system such as the DECCA (registered trademark) system. The digital loop filter includes a feedback circuit which receives a digital input signal from the digital loop filter and outputs a digital output signal and which feeds back and adds the digital output signal to the digital input signal after a predetermined delay. It also includes a feed-forward circuit which multiplies the digital input signal by a predetermined constant (B) and adds the resultant signal to the digital output signal of the feedback circuit to generate a digital output signal. A multiplier for multiplying the digital output signal of the feed-forward circuit by a second predetermined constant (C) to generate a digital output signal of the digital loop filter is also provided.

9 Claims, 9 Drawing Figures

DIGITAL LOOP FILTER

BACKGROUND OF THE INVENTION (1) Field of the Invention

The present invention relates to a digital loop filter and to a phase-tracking circuit using a digital loop filter. More particularly, it relates to a phase-locked circuit which uses a digital filter comprising a delay circuit, adders, and so on, and which is used, for example, in a phase-comparison radio navigation system such as the Decca (registered trademark) Navigator system.

(2) Description of the Prior Art

A conventional phase-tracking circuit uses an analog phase-locked loop filter comprising an operational amplifier having a high input resistance, a capacitor, resistors, and so on. However, such a conventional phase-tracking circuit has the following disadvantages:

1. The performance of the phase-tracking circuit is affected by a change in environmental conditions, such as temperature, humidity, and so on, because the electrical characteristics of the analog phase-locked loop filter change in accordance with a change in environmental conditions.

2. It is impossible to decrease the size of the phase-tracking circuit when it is used in a low frequency range since in a low frequency range the capacitor used in the phase-locked loop filter must be very large.

3. It is difficult to lower the cost of the phase-tracking circuit when it is used in a low frequency range because the cost of a high performance capacitor is high and it is difficult to form a capacitor having a high performance and a large capacitance in an integrated circuit device.

4. It is impossible to make a phase-tracking circuit which does not require adjustment because the electrical characteristics of the phase-locked loop filter have to be adjusted by using a variable resistor and/or a variable capacitor to compensate for the errors in resistance, capacitance, and so on in the filter circuit.

SUMMARY OF THE INVENTION

It is an object of the present invention to provide a digital loop filter which is not affected by a change in environmental conditions.

It is another object of the present invention to decrease the size of a digital loop filter even if it is used in a low frequency range.

It is still another object of the present invention to lower the cost of a digital loop filter.

It is yet another object of the present invention to provide a digital loop filter which does not necessitate adjustment.

It is a further object of the present invention to provide a digital loop filter which can be formed in an integrated circuit device.

According to the present invention, there is provided a digital loop filter including a feedback circuit which receives a digital input signal of the digital loop filter and outputs a digital output signal and which feeds back and adds the digital output signal to the digital input signal after a predetermined delay. The present invention also includes a feed-foward circuit which multiplies the digital input signal by a predetermined constant (B) and adds the resultant signal to the digital output signal of the feedback circuit to generate a digital output signal, and a multiplier for multiplying the digital output signal of the feed-forward circuit by a second predetermined constant (C) to generate a digital output signal of the digital loop filter.

DESCRIPTION OF THE PREFERRED EMBODIMENT

With reference to the attached drawings, embodiments of the present invention will be explained in comparison with conventional examples.

A general phase-tracking circuit, i.e., a phase-locked circuit, comprises a voltage-controlled oscillator, a phase detector, and a loop filter, i.e., a low-pass filter inserted into a feedback loop of the phase-locked circuit. Instead of a voltage-controlled oscillator, it is possible to use a combination of a reset integrator for integrating the error voltage transmitted from the phase detector and a phase shifter for shifting the phase of a clock signal in accordance with the output of the reset integrator.

Figure 1A:
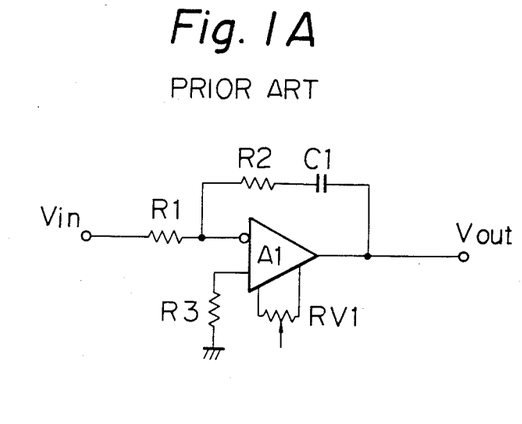
FIG. 1A is a circuit diagram of an analog phase-locked loop filter used in a conventional phase-tracking circuit.

FIG. 1A is a circuit diagram of a conventional analog-type loop filter used in a conventional phase-tracking circuit. The loop filter of FIG. 1A comprises an operational amplifier A1, resistors R1, R2 and R3, a capacitor C1, and a variable resistor RV1 for adjusting the offset voltage. The gain-angular frequency characteristic of the loop filter of FIG. 1A is the same as that illustrated in FIG. 5.

Figure 1B:
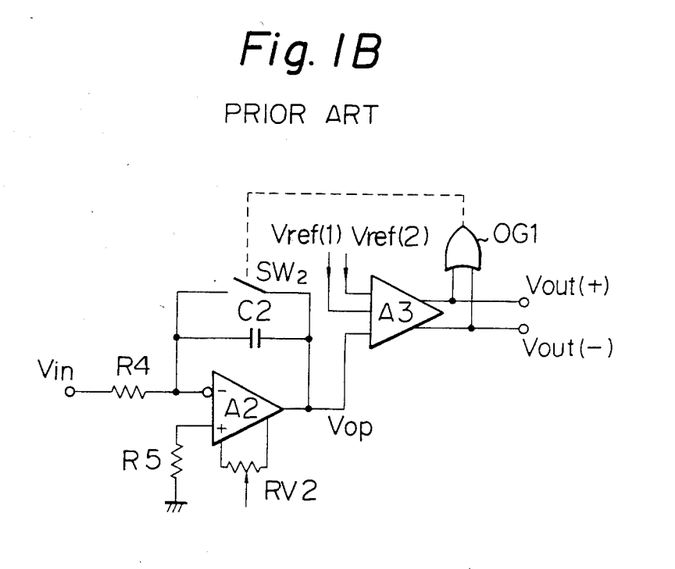
FIG. 1B is a circuit diagram of an analog reset integrator used in a conventional phase-tracking circuit.

FIG. 1B is a circuit diagram of a conventional analog-type reset integrator used in a conventional phase-tracking circuit. The reset integrator of FIG. 1B comprises an operational amplifier A2, a comparator A3, an OR gate OG1, a switch SW2, a variable resistor RV2 for adjusting the offset voltage, resistors R4 and R5, and a capacitor C2.

In the reset integrator of FIG. 1B, if the switch SW2 is in a turned off condition and a positive input voltage $V_{in}$ is applied to the input terminal, the ouput voltage $V_{op}$ of the operational amplifier A2 gradually falls. When the output voltage $V_{op}$ reaches a reference voltage $V_{ref}(1)$ applied to the comparator a A3, the output voltage $V_{out}(-)$ of the comparator A3 becomes high. The output voltage $V_{out}(-)$ drives the switch SW2 through the OR gate OG1, and thereby the switch SW2 is closed and the electric charges of the capacitor C2 are discharged. Consequently, the output voltage $V_{op}$ rises to an initial voltage and the output voltage $V_{out}(-)$ of the comparator A3 returns to low. The reset integrator of FIG. 1B repeats such operations as long as the positive input voltage $V_{in}$ is applied.

If a negative input voltage $V_{in}$ is applied to the input terminal, the output voltage $v_{op}$ of the operational amplifier A2 gradually rises. When the output voltage $V_{op}$ reaches a reference voltage $V_{ref}(2)$ applied to the comparator A3, the output voltage $V_{out}(+)$ of the comparator A3 becomes high. The output voltage $V_{out}(+)$ drives the switch SW2 through the OR gate OG1 and discharges the electric charges of the capacitor C2 in a manner similar to that in the above-mentioned case. Consequently, the output voltage $V_{op}$ falls to the initial voltage and the output voltage $V_{out}(+)$ returns to low. In the circuit of FIG. 1B, the comparator A3 practically comprises two comparators, to which the voltages $V_{op}$ and $v_{ref}(1)$ and the voltages $V_{op}$ and $V_{ref}(2)$ are, respectively, applied.

Figure 2:
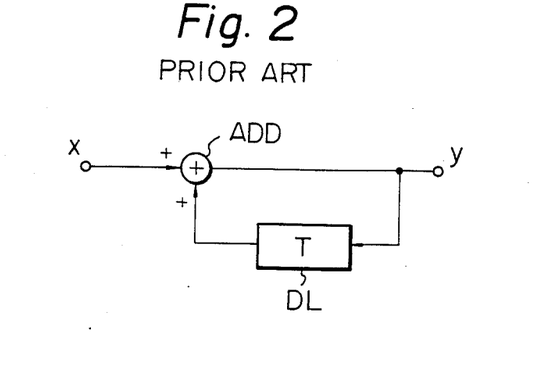
FIG. 2 is a block circuit diagram of a conventional digital low-pass filter.

FIG. 2 is a conventional digital-type low-pass filter. In the figure, ADD is an adder and DL is a delay circuit having a delay T. In practice, the delay circuit DL samples the signal input therein at a sampling time T and outputs it after a time period T, thereby delaying the input signal for the time T. The relation between the input x and the output y of the filter of FIG. 2 is as follows:

$$y = x + ye^{-j\omega T} \quad (1)$$
$$= \frac{x}{(1 - \cos \omega T) + j \sin \omega T}$$

Assuming that $\omega T$ is sufficiently smaller than "1", the formula (1) becomes:

$$y = \frac{x}{j\omega T} \quad (2)$$

Figure 3:
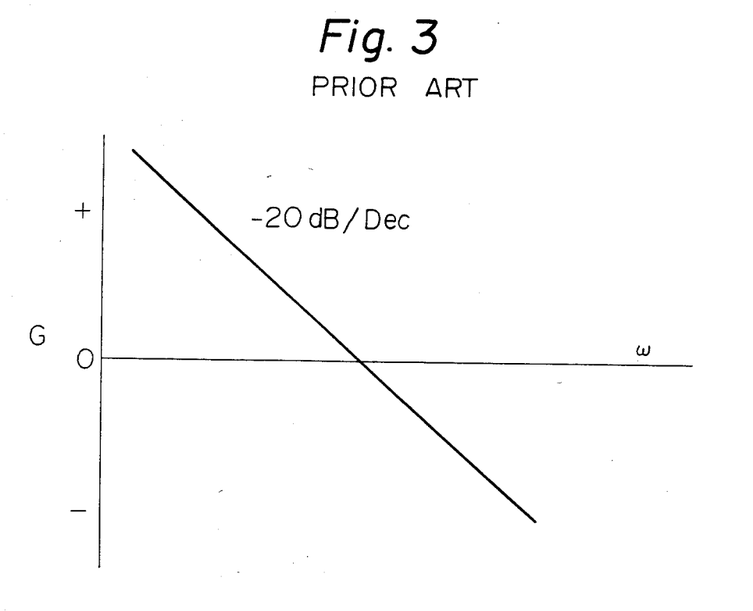
FIG. 3 is a graph of the gain-angular frequency characteristic of the digital low-pass filter of FIG. 2.

The formula (2) represents the characteristic of an integrator, and, therfore, the filter of FIG. 2 operates as an integrator, i.e., as a low-pass filter, whose gain-angular frequency characteristic is shown in FIG. 3.

However, the low-pass filter of FIG. 2 is not adaptable to a loop filter of a phase-locked circuit because the high frequency gain of the low-pass filter of FIG. 2 steadily decreases in accordance with an increase in the angular frequency, with the result that the gain in a high frequency range is very small. Therefore, if the filter of FIG. 2 is used as a loop filter of a phase-locked circuit, the high frequency component of the error voltage supplied to a voltage-controlled oscillator from a phase detector via the loop filter, is too small. Consequently, the pull-in operation cannot be performed reliably.

Moreover, since the low frequency gain of the filter of FIG. 2 steadily increases in accordance with a decrease in the angular frequency, the adder ADD and/or the delay circuit DL overflow and output erroneous data when a signal having a very low frequency and a relatively large magnitude is transmitted to the input of the filter of FIG. 2. Therefore, the digital filter of FIG. 2 does not operate correctly when a signal having a low frequency and a relatively large magnitude is input thereinto, and, consequently, it is not preferable to use such a filter in a phase-locked circuit.

Figure 4:
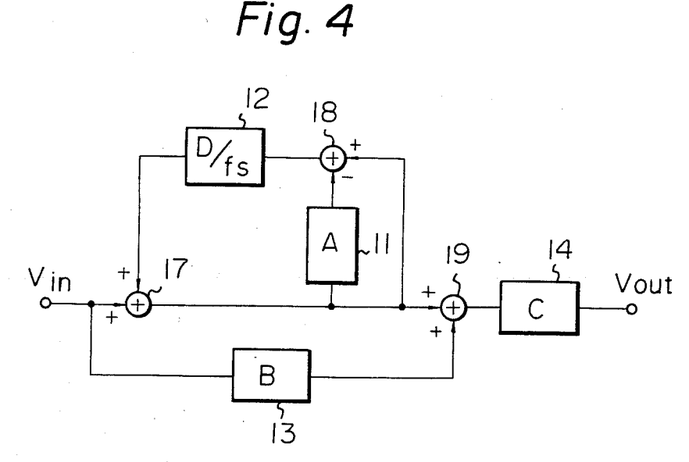
FIG. 4 is a block circuit diagram of an embodiment of a digital phase-locked loop filter used in a phase-tracking circuit in accordance with the present invention.

FIG. 4 is a digital-type loop filter according to the present invention. In FIG. 4, reference numbers 11, 13 and 14 are digital-type multipliers, each of which has a sampler for sampling input data by using sampling pulses at the input stage thereof, a multiplying circuit for multiplying the sampled input data by a predetermined constant, and a register for storing the resultant data transmitted from the multiplying circuit. For the sake of simplicity, illustration of the components in each of the multipliers is omitted in FIG. 4. Reference number 12 designates a digital-type delay circuit. The delay circuit 12 has a sampler for sampling input data by using sampling pulses at the input stage thereof, a circuit for delaying the sampled input data by a delay time which is a sum obtained by multiplying a predetermined coefficient D and a sampling interval, and a register for storing the resultant data transmitted from the delay circuit, the resultant data being output therefrom after the sampling interval. Reference numbers 17, 18, and 19 designate adders, each of which includes an adding circuit and a register for storing the resultant data generated by the adding circuit. Illustration of these components of each of the adders 17, 18 and 19 is also omitted in FIG. 2 for the sake of simplicity.

Operation of the digital-type loop filter of FIG. 4 will now be explained. Input digital data $V_{in}$ is added to the output data of the delay circuit 12, the output data is initially zero, by the adder 17, and the resultant output data from the adder 17 is input into the multiplier 11 and the adders 18 and 19. The multiplier 11 multiplies the output data of the adder 17 by a predetermined constant A and transmits the resultant output data thereof to the adder 18. The adder 18 adds the output data of the adder 17 and the output data of the multiplier 11 and transmits the resultant output data thereof to the delay circuit 12, which delays the output of the adder 18 by a predetermined value and inputs the delayed data into the adder 17 after a sampling interval. The input digital data $V_{in}$ is also transmitted to the multiplier 13, which multiplies it by a predetermined constant B and inputs the resultant data into the adder 19. The adder 19 adds the output data of the multiplier 13 and the output data of the adder 17 and transmits the resultant data to the multiplier 14, which multiplies the resultant output data of the adder 19 by a predetermined constant C and generates output data $V_{out}$. These additions and multiplications are effected for each sampling time by the above-mentioned adders and multipliers, and each of the adders and multipliers stores the resultant data in a register provided therein. The resultant data stored in each of the registers is used as output data, i.e., as operand data, at the next sampling interval. The data stored in each of the registers is renewed after the arithmetic operation, i.e., addition or multiplication, is finished. A sampling frequency $f_s$, sufficiently higher than the cutoff frequency of the low-pass filter, is selected so that signals having the frequency $f_s$ are not output directly to the low-pass filter.

The transfer function of the low-pass filter of FIG. 4, which was calculated by the present inventors, is as follows:

$$F(\omega) = \frac{1}{\{1 - (1 - A) \cos \omega D/f_s\} + j(1 - A) \sin \omega D/f_s} + B \quad (3)$$

In the formula (3), if $\omega D$ is sufficiently smaller than $f_s$, if A is nearly equal to $2^{-20}$, which is nearly equal to $10^{-6}$, if B is nearly equal to $2^6$, and if D is nearly equal to $2^1$, the formula is simplified to read as follows:

$$F(\omega) = \frac{1}{A} \cdot \frac{1 + j\omega DB/f_s}{1 + j\omega D/Af_s} \quad (4)$$

Figure 5:
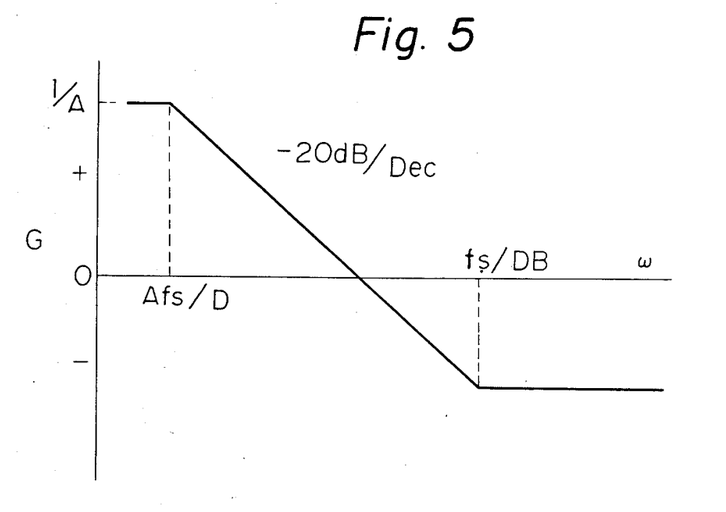
FIG. 5 is a graph of the gain-angular frequency characteristic of the filter of FIG. 4.

The formula (4) shows that the filter of FIG. 4 has the characteristic of a low-pass filter, which is illustrated in FIG. 5. The gain of the filter of FIG. 4 in a very low frequency range becomes 1/A, which can be very large and which can be adjusted by changing the value of the constant A. The angular frequency of the breakpoint in a low frequency range becomes $Af_s/D$ and the angular frequency of the breakpoint in a high frequency range becomes $f_s/DB$. Therefore, the low frequency characteristic and the high frequency characteristic of the filter of FIG. 4 can be easily adjusted by changing the constant A of the multiplier 11 and the constant B of the multiplier 13, respectively.

Figure 6:
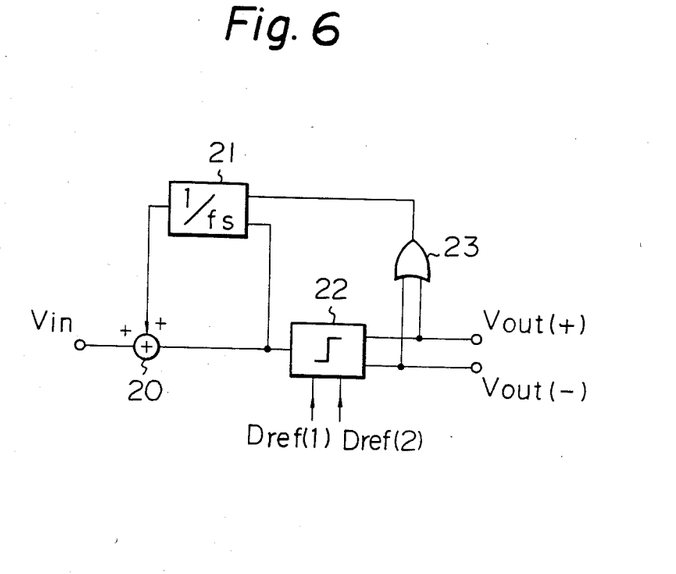
FIG. 6 is a block circuit diagram an embodiment of a digital reset integrator used in a phase-tracking circuit in accordance with the present invention.

FIG. 6 is a digital-type reset integrator used in the phase-tracking circuit according to the present invention. The reset integrator of FIG. 6 comprises an adder 20, a multiplier 21, a comparator 22, and an OR gate 23. The comparator 22 is digital. It has substantially the same function as that of the aformentioned comparator A3 of FIG. 1B except that the comparator 22 handles digital data.

In the reset integrator of FIG. 6, input digital data $V_{in}$ is added to the output data of the multiplier 21 by the adder 20, and the resultant data generated by the adder 20 is input into the comparator 22. The comparator 22 compares the output data of the adder 20 with the reference data $D_{ref}(1)$ and $D_{ref}(2)$. If the amount of output data of the adder 20 is larger than the amount of reference data $D_{ref}(1)$, an output pulse signal $V_{out}(+)$ is output and the register of the multiplier 21 is cleared, thereby returning the reset integrator to its initial condition. If the amount of output data of the adder 20 is smaller than the amount of reference data $D_{ref}(1)$, an output pulse signal $V_{out}(-)$ is output and the register of the multiplier 21 is cleared, thereby returning the reset integrator to the initial condition.

A microcomputer which performs the same functions as those of the loop filter of FIG. 4 and the reset integrator of FIG. 6 can be substituted for the loop filter and the reset integrator. Such a microcomputer is more compact and cheaper than the loop filter and the reset integrator, which are constructed by using digital integrated circuit devices.

Figure 7:
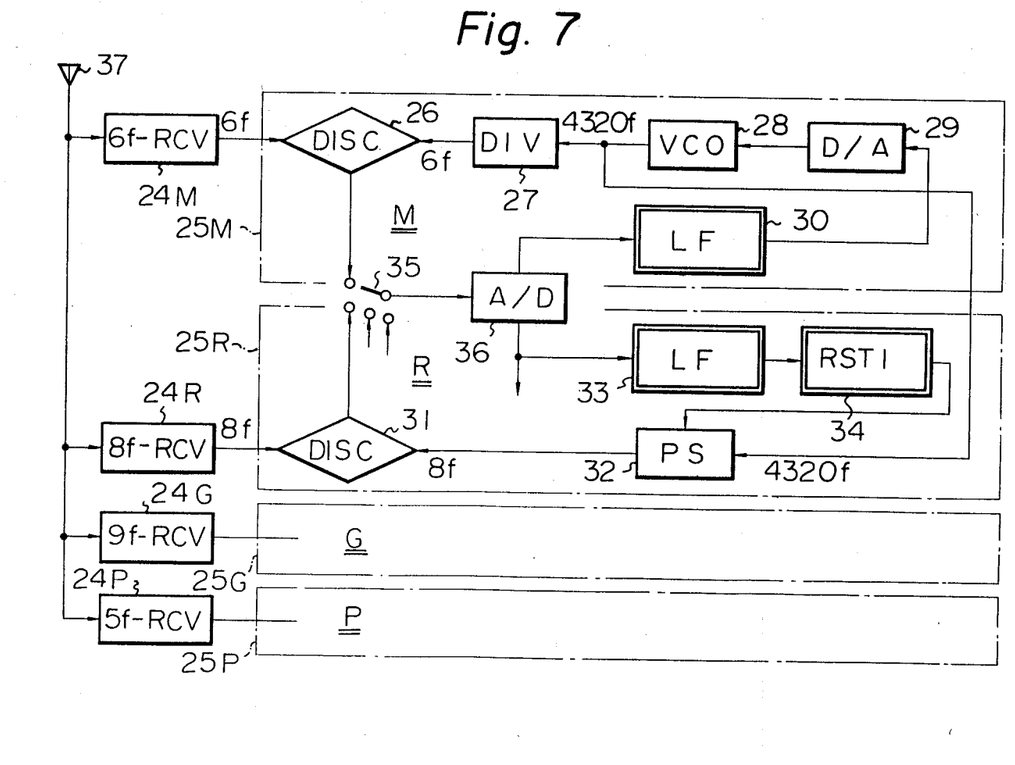
FIG. 7 is a block circuit diagram of a receiver for a phase-comparison radio navigation system, which uses phase-tracking circuits according to the present invention.

FIG. 7 is a receiver for a phase-comparison radio navigation system which uses phase-tracking circuits according to the present invention. The receiver of FIG. 7 comprises four receiving units 24M, 24R, 24G, and 24P which receive and amplify 6f, 8f, 9f and 5f signals radiated from a master station, a red slave station, a green slave station, and a purple slave station, respectively, via an antenna 37. The receiver of FIG. 7 further comprises four phase-tracking circuits 25M, 25R, 25G, and 25P which are connected to the receiving units 24M, 24R, 24G, and 24P, respectively.

The phase-tracking circuit 25M comprises a voltage-controlled oscillator 28, a phase discriminator 26 which generates an error voltage proportional to the phase difference between the received 6f signal and an output signal of the voltage-controlled oscillator 28, a frequency divider 27, a digital-to-analog converter (DAC) 29, and a loop filter 30 having the structure shown in FIG. 4.

The phase-tracking circuit 25R, corresponding to the red slave station, comprises a digital phase shifter 32, a phase discriminator 31 which generates an error voltage proportional to the phase difference between the received 8f signal and an output signal of the digital phase shifter 32, a loop filter 33 having the structure of FIG. 4, and a reset integrator 34 having the same structure as that of FIG. 6. Each of the phase-tracking circuits 25G and 25P has the same structure as that of the phase-tracking circuit 25R. Therefore, detailed illustrations thereof are omitted. In FIG. 7, reference number 35 designates a switch for selectively connecting the output terminals of the phase discriminators 26, 31, etc., to an analog-to-digital converter (ADC) 36 which converts each of the analog error voltages transmitted from the phase discriminators into digital signals. The switch 35 and the ADC 36 are used in common by the phase-tracking circuits 25M, 25R, 26G, and 25P.

In the receiver of FIG. 7, the 6f signal received by the antenna 37 and the receiving unit 24M is transmitted to one of the input terminals of the phase discriminator 26, and another input terminal thereof receives an output signal from the frequency divider 27, the output signal is generated by dividing an output signal of the voltage-controlled oscillator 28 by a constant value, e.g., 180. The phase discriminator 26 outputs an error voltage corresponding to the phase difference between two input signals supplied thereto. In a similar manner, the phase discriminator 31 outputs an error voltage corresponding to the phase difference between the received 8f signal and the output signal of the digital phase shifter 32. The error voltages generated by the phase discriminators 26, 31, etc., are input to the switch 35, and one of the error voltages selected by the switch 35 is converted by the ADC 36 into a digital error voltage. The digital error voltage generated by the ADC 36 is output synchronously with the switching operation of the switch 35 and is input to the corresponding loop filters 30, 33, etc. The values of the digital error voltages generated by the ADC 36 are always memorized by corresponding memories provided for each station, such as the master station, the red slave station, and so on.

In the phase-tracking circuit 25M, corresponding to the master station, the digital error voltage memorized in the corresponding memory of the ADC 36 is input into the loop filter 30 and is smoothed. Then the smoothed digital error voltage is input into the DAC 29 and is again converted into an analog error voltage, i.e., a control voltage. The control voltage is applied to the voltage-controlled oscillator 28, which generates a signal having a frequency corresponding to the control voltage. In this manner, the phase-tracking operation is effected, in which a noisy signal received from the master station is phase-tracked without being affected by noises superposed thereon.

In the phase-tracking circuit 25R, corresponding to the red slave station, the digital error voltage transmitted from the ADC 36 is smoothed by the loop filter 33. The smoothed digital error voltage is input into the reset integrator 34 and is integrated. The reset integrator 34 clears an integrated value when it goes beyond predetermined reference values and shifts the digital phase shifter 32 for one timing. Consequently, a noisy signal received from the red slave station is phase-tracked without being affected by noise superposed thereon.

In the receiver of FIG. 7, the output signal of the voltage-controlled oscillator 28, whose frequency is, for example, 4320f, is transmitted to the phase shifter 32 as a clock signal. Since the output signal of the voltage-controlled oscillator 28 is phase-locked with the signal received from the master station, the phase-shift range of the phase shifter 32 can be relatively small. Therefore, the cutoff frequency of the loop filter 33 of the phase-tracking circuit 25R can be much lower than that of the loop filter 30 of the phase-tracking circuit 25M, with the result that the phase-tracking circuit 25R has a high noise immunity.

Figure 8:
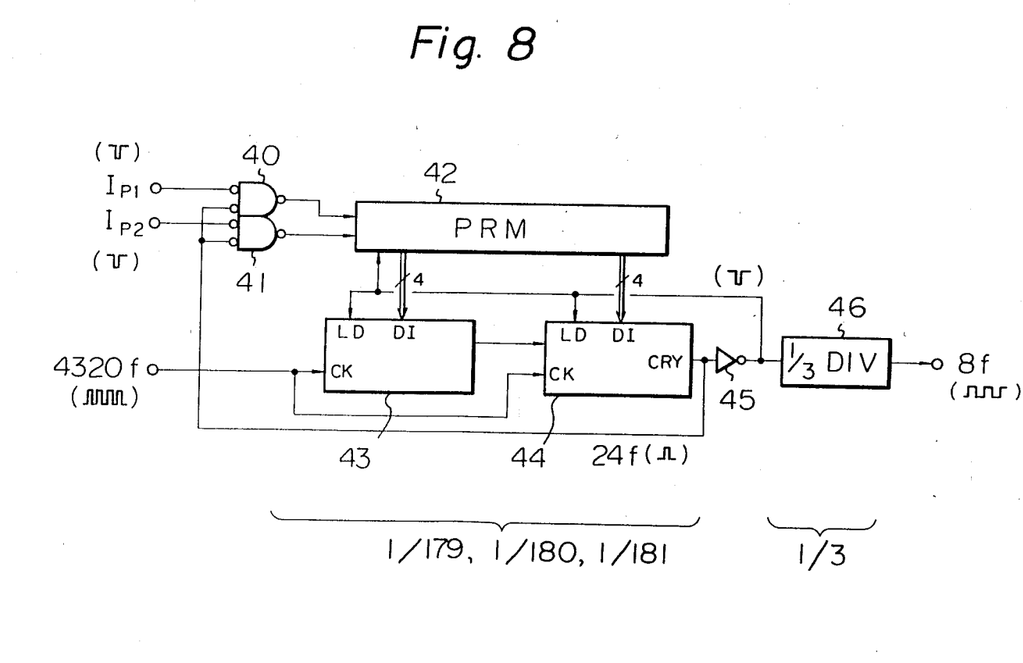
FIG. 8 is a block circuit diagram of a digital phase shifter used in the receiver of FIG. 7.

FIG. 8 illustrates in detail the structure of the digital phase shifter 32 of FIG. 7. The digital phase shifter of FIG. 8 comprises gates 40 and 41, a memory circuit 42 which stores a preset initial value, counters 43 and 44 which form a first frequency divider, an inverter 45, and a second frequency divider 46. Each of the counters 43 and 44 is a presettable synchronous 4-bit binary counter of, for example, the SN74LS161AN type manufactured by Texas Instruments Semiconductor Company. Input terminals $I_{P1}$ and $I_{P2}$ of the gates 40 and 41 are connected to the output terminals $V_{out}(+)$ and $V_{out}(-)$ of the reset integrator of FIG. 6. The input signal of the first frequency divider which is transmitted to the clock terminals CK of the counters 43 and 44 and which has a frequency of 4320f is transmitted from the output of the voltage-controlled oscillator 28 (FIG. 7). The output signal of the second frequency divider 46 is transmitted to the phase discriminator 31 (FIG. 7).

In the digital phase shifter of FIG. 8, if none of the input pulses are transmitted to the input terminals $I_{P1}$ and $I_{P2}$ from the reset integrator 34, the memory circuit 42 transmits an initial value "76" to the first frequency divider, i.e., to data input terminals DI of the counters 43 and 44. The first frequency divider counts up the clock signals from the initial value of "76" and outputs a positive going pulse from a carry terminal CRY of the counter 44 when the count value of the first frequency divider reaches "256". Therefore, the dividing ratio of the first frequency counter becomes "180" (=256−76). The positive going pulse is transmitted to the gates 40 and 41 to inhibit transmission of the input pulses to the memory circuit 42. The positive going pulse is inverted by the inverter 45 and is transmitted to a load signal terminal LD of the counters 43 and 44 to load the initial value thereto and to the memory circuit 42 to reset the stored content thereof. The positive going pulse having a frequency of 24f is divided by three by the second frequency divider 46, which outputs the 8f signal as the output signal of the digital phase shifter.

If an input pulse, i.e., an advance pulse, is input to the input terminal $I_{P1}$ of the gate 40 from the reset integrator 34 when the positive going pulse output from the carry terminal CRY of the counter 44 is not generated, the gate 40 outputs a negative going pulse which is transmitted to the memory circuit 42. The memory circuit 42 loads an initial value "77" into the data input terminals DI of the counters 43 and 44, forming a first frequency divider. The first frequency divider counts up the clock signals from the preset initial value "77" to the last value "256" and outputs a positive going pulse from the carry terminal CRY of the counter 44. Therefore, the dividing ratio of the first frequency divider becomes "179" (=256−77). The frequency division of 179 is effected only once for one advance pulse.

If an input pulse, i.e., a retard pulse, is transmitted to the input terminal $I_{P2}$ of the gate 41 from the reset integrator 34, the memory circuit 42 loads an initial value "75" onto the first frequency divider so that the first frequency divider counts "181" (=256−75).

I claim:
1. A digital loop filter operatively connected to receive a digital input signal, comprising:
a feedback circuit for receiving the digital input signal of the digital loop filter, for outputting a first digital output signal, for feeding back and adding the first digital output signal to the digital input signal after a predetermined delay, and for outputting a second digital output signal, said feedback circuit including:
a first multiplier, operatively connected to receive the second digital output signal, for multiplying the second digital output signal by a third predetermined constant and outputting the resultant signal after said predetermined delay; and
a first adder, operatively connected to said first multiplier, for adding the resultant output signal from said first multiplier and the second digital output signal; and
a first feed-forward circuit, operatively connected to receive the second digital output signal, for controlling the second digital output signal of said feedback circuit;
a second feed-forward circuit, operatively connected to said feedback circuit, for multiplying the digital input signal by a first predetermined constant, for adding the resultant signal to the second digital output signal of said feedback circuit and for generating a third digital output signal; and
a second multiplier, operatively connected to said second feed-forward circuit, for multiplying the third digital output signal of said second feed-forward circuit by a second predetermined constant and for generating a fourth digital output signal of the digital loop filter.

2. A digital loop filter according to claim 1, wherein said first feed-forward circuit comprises:
a third multiplier, operatively connected to said feedback circuit and operatively connected to receive the digital input signal, for multiplying the digital input signal by a fourth predetermined constant and for outputting a multiplied signal; and
a second adder, operatively connected to said third multiplier, for adding the multiplied signal from said third multiplier and the digital input signal and for outputting a digital output signal.

3. A phase-tracking circuit for generating an output signal which is phase-locked with an input signal having high frequency components and operatively connected to receive a control signal, said phase-tracking circuit comprising:
signal-generating means, operatively connected to receive the control signal, for generating an output signal, the phase of the output signal of said signal-generating means being controlled by the control signal;
a phase discriminator, operatively connected to said signal generating means, for detecting the phase difference between the output signal of said signal-generating means and the input signal of said phase-tracking circuit and for outputting an output signal; and
a digital loop filter, operatively connected to said phase discriminator, for attenuating the high frequency components of the output signal by digitalizing the output signal of said phase discriminator, and for generating the control signal, said digital loop filter comprising:

a feedback circuit, operatively connected to said phase discriminator, for receiving the digitalized output signal, for outputting a first digital output signal, and for feeding back and adding the first digital output signal to the digitalized output signal after a predetermined delay, said feedback circuit including:

a first multiplier, operatively connected to said feedback circuit, for multiplying the first digital output signal by a first predetermined constant and for outputting a resultant signal after said predetermined delay;

a first adder, operatively connected to said first multiplier, for adding the resultant signal output from said first multiplier and the output signal of said phase discriminator;

a first feed-forward circuit, operatively connected to said feedback circuit, for controlling the feedback signal of said feedback circuit;

a second feed-forward circuit, operatively connected to said feedback circuit, for multiplying the first digitalized output signal by a second predetermined constant, for adding the resultant signal to the first digital output signal of said feedback circuit and for generating a second digital output signal; and a second multiplier, operatively connected to said second feed-forward circuit, for multiplying the second digital output signal of said second feed-forward circuit by a third predetermined constant and for generating a third digital output signal of said digital loop filter.

4. A phase-tracking circuit according to claim 3, wherein said first feed-forward circuit comprises:

a third multiplier, operatively connected to said feedback circuit, for multiplying the digitalized output signal by a fourth predetermined constant and for outputting a resultant signal; and a second adder, operatively connected to said third multiplier, for adding the resultant signal of said third multiplier and the digitalized output signal and for generating an output digital signal.

5. A phase-tracking circuit according to claim 3, wherein said signal-generating means comprises a voltage-controlled oscillator for generating a signal having a frequency corresponding to the control signal.

6. A phase-tracking circuit according to claim 4, wherein said signal-generating means comprises:

a reset integrator operatively connected to receive the input signal and provide an output signal; and a digital phase shifter, operatively connected to said reset integrator, controlled by the output signal of said reset integrator.

7. A phase-tracking circuit according to claim 6, wherein said reset integrator comprises:

a resettable digital delay circuit, operatively connected to receive the input signal, for delaying the input signal for one sampling period and for outputting an output delay signal;

an adder, operatively connected to said digital delay circuit, for adding the input signal and the output delay signal of said resettable digital delay circuit and for outputting a signal to said resettable digital delay circuit; and comparator means, operatively connected to said adder and said resettable digital delay circuit, for comparing the output signal of said adder with a first reference value and a second reference value and for outputting an advance pulse or a retard pulse when the output signal of said adder reaches the first reference value or the second reference value, respectively, said resettable digital delay circuit being reset to an initial value when the advance pulse or retard pulse is generated.

8. A receiver for a phase-comparison radio navigation system, operatively connected to receive a control signal, having phase-tracking circuits for receiving input signals having high frequency components and for generating output signals phase-locked with the received input signals which are transmitted by a master station and a plurality of slave stations, said phase-tracking circuit comprising:

signal-generating means, operatively connected to receive the control signal, for generating a first output signal, the phase of the first output signal of said signal-generating means being controlled by the control signal;

a phase discriminator, operatively connected to said signal-generating means, for detecting the phase difference between the first output signal of said signal-generating means and the input signals of said phase-tracking circuit and for generating a second output signal;

an A/D converter, operatively connected to said phase discriminator, for receiving and digitalizing the second output signal;

a digital loop filter, operatively connected to said A/D converter, for attenuating the high frequency components of the second digitalized output signal and for generating the control signal, said digital loop filter comprising:

a feedback circuit, operatively connected to said phase discriminator, for receiving the control signal, for outputting a first digital output signal, for adding the first digital output signal to the second output signal after a predetermined delay and for generating a third output signal;

a feed-forward circuit, operatively connected to said feedback circuit, for multiplying the third output signal by a predetermined constant and for adding the resultant signal to the first digital output signal of said feedback circuit to generate a second digital output signal; and a multiplier, operatively connected to said feed-forward circuit, for multiplying the second digital output signal of said feed-forward circuit by a second predetermined constant and for generating a third digital output signal;

a D/A converter, operatively connected to said digital loop filter, for receiving the control signal and converting it into an analog signal; and a frequency divider operatively connected between said D/A converter and said phase-discriminator.

9. A receiver according to claim 8, wherein said signal-generating means of at least one of said phase-tracking circuits comprises a voltage controlled oscillator for generating a signal having a frequency corresponding to said control signal and wherein said signal-generating means of the remaining said phase-tracking circuits comprises a reset integrator for generating output signals and a digital phase shifter operatively connected to said reset integrator and controlled by the output signals of said reset integrator.

* * * * *